(12) United States Patent
Farjadrad

(10) Patent No.: US 7,805,642 B1
(45) Date of Patent: Sep. 28, 2010

(54) LOW POWER ITERATIVE DECODER USING INPUT DATA PIPELINING AND VOLTAGE SCALING

(75) Inventor: Ramin Farjadrad, Mountain View, CA (US)

(73) Assignee: Aquantia Corporation, Milpitas, CA (US)

( * ) Notice: Subject to any disclaimer, the term of this patent is extended or adjusted under 35 U.S.C. 154(b) by 891 days.

(21) Appl. No.: 11/676,946

(22) Filed: Feb. 20, 2007

Related U.S. Application Data

(60) Provisional application No. 60/774,906, filed on Feb. 17, 2006.

(51) Int. Cl.
*H03M 13/15* (2006.01)
*H03M 13/37* (2006.01)
(52) U.S. Cl. .................. 714/708; 714/752; 714/780
(58) Field of Classification Search .............. 714/708, 714/752, 780
See application file for complete search history.

(56) References Cited

U.S. PATENT DOCUMENTS

| | | | | |
|---|---|---|---|---|
| 4,839,639 A * | 6/1989 | Sato et al. | .................. | 340/7.34 |
| 6,735,725 B1 * | 5/2004 | Wu et al. | ..................... | 714/704 |
| 6,980,140 B1 * | 12/2005 | Rowland et al. | ............ | 341/118 |
| 7,320,091 B2 * | 1/2008 | Blaauw et al. | ................ | 714/30 |
| 7,673,212 B2 * | 3/2010 | Ji | .............................. | 714/752 |

* cited by examiner

*Primary Examiner*—Stephen M Baker
(74) *Attorney, Agent, or Firm*—Sawyer Law Group, P.C.

(57) ABSTRACT

A decoder architecture and method for processing codewords are provided. In one implementation, the decoder architecture includes an input buffer configured to receive and store one or more codewords to be processed, and a decoder configured to receive codewords one at a time from the input buffer. The decoder processes each codeword only for a minimum amount of time for the codeword to become error free. The decoder architecture further includes an input buffer monitor and supply regulator configured to change a voltage supply to the decoder responsive to an average amount of time or each codeword to become error free.

20 Claims, 3 Drawing Sheets

LOW POWER ITERATIVE DECODER USING INPUT DATA PIPELINING AND VOLTAGE SCALING

CROSS-REFERENCE TO RELATED APPLICATIONS

This application claims benefit under 35 USC 119(e) of Provisional Application No. 60/774,906, filed on Feb. 17, 2006.

FIELD OF THE INVENTION

The present invention relates generally to data communications, and more particularly to error correction in data communications.

BACKGROUND OF THE INVENTION

An error correcting decoder is typically implemented, e.g., in a network system, to reduce communication errors. One type of an error correcting decoder is an iterative error correcting decoder. Iterative error correcting decoders typically use a large-scale parallel network of nodes performing soft probability calculation. These nodes exchange probability information of a received data block among one another. After a certain number of iterations within an iterative decoder structure, individual noisy information in a data block (or word) is transformed into an estimate of the word as a whole. Examples of iterative decoders are the low density parity check (LDPC) decoders, Hamming decoders, Reed-Solomon decoders, Turbo decoders, and the like.

The structure of an iterative error correcting decoder can be represented graphically by a factor graph. A factor graph consists of nodes and edges, where the edges represent wire connections between the nodes, and a node represents a function of its inputs. For example, in a low density parity check (LDPC) factor graph, there are two types of nodes representing two distinct functions—i.e., "equality constraint" nodes and "parity check" nodes. According to the IEEE 802.3ae (10 GBASE-T) standard, the proposed LDPC decoder consists of (2048) equality constraint nodes and (384) parity check nodes. Each equality constraint node has (6) bidirectional connections to corresponding parity constraint nodes and each parity check node has a total of (32) bidirectional connections to corresponding equality constraint nodes. This results in a factor graph with network matrix of (12,228) connections. The probabilities associated with received bit values iterate between these two node functions to finally resolve the most probable value of each data bit.

LDPC code is specified by a parity check matrix (which is commonly referred to as an H matrix) having a very few number of "ones" per row. An example H matrix 100 is shown in FIG. 1. The length of each codeword is equal to the number of columns in the H matrix 100. In one example, each codeword is created such that the parity of each set of bits corresponding to the "ones" in a row is even. The number of rows corresponds to the number of parity checks that the codeword must satisfy. Therefore, if all errors in a received codeword are corrected by the decoder, all parity checks must be satisfied for the output codeword.

An important feature of one implementation of an iterative decoder is the number of iterations that the iterative decoder can perform on an input codeword in a given amount of time as it relates to the bit error rate (BER) of the iterative decoder. A higher number of iterations results in a better BER performance of an iterative decoder. Therefore, to maximize the performance of a single iterative decoder, it is generally preferred to have a given iterative decoder perform a higher number of iterations to go through a certain number of equality constraint and parity check nodes (which determines the BER performance of the iterative decoder). Accordingly, there is a trade off between the number of iterations an iterative decoder can perform in a time interval of each data codeword versus the power and complexity of the iterative decoder. In a digital iterative decoder, one can increase the clock frequency, increase the gate sizes, add more flip-flops between logic stages, adopt different implementation architectures, and/or run at higher supply voltage in order to get more iterations per codeword at cost of more power. More iterations can also be achieved by pipelining two or more iterative decoders in series, so that one iterative decoder works on the decoded output codeword of the prior iterative decoder. Such an approach, however, translates into more area and power.

BRIEF SUMMARY OF THE INVENTION

In general, in one aspect, this specification describes a novel technique to increase the effective decoding time of a decoder (e.g., an iterative error correcting decoder) by the addition of an input buffer (or FIFO) together with low-complexity combinational logic. In one implementation, the added FIFO and combinational logic consumes significantly less power and area compared to the additional power and area in a conventional approach to reach the same performance. Accordingly, in one implementation, a decoding architecture is provided that includes an input buffer configured to store one or more codewords to be processed, and a decoder configured to receive a codeword to be processed from the input buffer. The decoder processes the received codeword only for the minimal amount of time required for the received codeword to become error free.

Implementations can include one or more of the following features. The input buffer can be a FIFO buffer. The decoder can be an iterative decoder. The decoding architecture can further include a supply regulator configured to adjust the supply voltage to the decoder. A critical-path voltage controlled oscillator (VCO) that clocks the logic inside the decoder at the maximum frequency possible without any timing violations at the given supply. And a FIFO/buffer monitor logic that adjusts the decoding speed based on available depth in buffer by controlling the regulated supply. The decoding architecture can further include an output (FIFO) buffer of the same depth as the input (FIFO) buffer. The input buffer can receive codewords (to be processed by the decoder) at a rate that is at least faster than the time required for the decoder to fully correct a worst case codeword. The input buffer can receive codewords (to be processed by the decoder) at a constant or variable rate.

The details of one or more implementations are set forth in the accompanying drawings and the description below. Other features and advantages will be apparent from the description and drawings.

BRIEF DESCRIPTION OF THE DRAWINGS

Like reference symbols in the various drawings indicate like elements.

DETAILED DESCRIPTION OF THE INVENTION

The present invention relates generally to data communications, and more particularly to error correction in data communications. The present invention is not intended to be limited to the implementations shown but is to be accorded the widest scope consistent with the principles and features described herein.

An important observation with regards to iterative decoding is that not all received codewords require the same number of iterations to become error free. The reason is due to the random nature of channel noise, not all received codewords have the same bit probabilities of one or zero—i.e., there is not the same number of errors per codeword. Conventionally, the number of iterations that an iterative decoder must perform is set (i.e., fixed) such that the worst case codeword received (given a target BER) can be fully corrected (or be error free). However, the majority of the received codewords typically require fewer iterations while a worst case codeword is rarely received, especially in very low BER systems (e.g., high SNR (signal to noise ratio) systems). For example, presentations to the IEEE P802.3an task force describe a minimum of 6 iterations to correct all data patterns for a BER=10E-12 scenario. Extensive LDPC simulation has shown that only one out of 1,600,000 received codewords may require 6 iterations, while after only 3 iterations fewer than one out of 5,000 codewords are still in error.

Accordingly, in one implementation, each codeword is processed in the decoder only for the minimum time required for that codeword to become error free. Since the majority of the codewords are decoded in fewer iterations or in less time relative to a worst case codeword, a conventional decoder implementation that, for example, implements 6 iterations for each received codeword will generally perform needless iterations and, therefore, experience excess decoding time. Thus, according to one implementation of the present inventions, excess decoding times are saved and accumulated for subsequent codewords that may require a higher decoding time. Therefore, one can set the average decoding interval at a value between the maximum required for worst case (e.g., 6 iterations) and the minimum required to decode majority of the received codewords (e.g., 3 iterations). Determining the minimum and maximum decoding times can be found empirically given the decoder H matrix and system conditions and/or application requirements. Other suitable techniques for determining the maximum and minimum decoding times can also be used.

Figure 1:
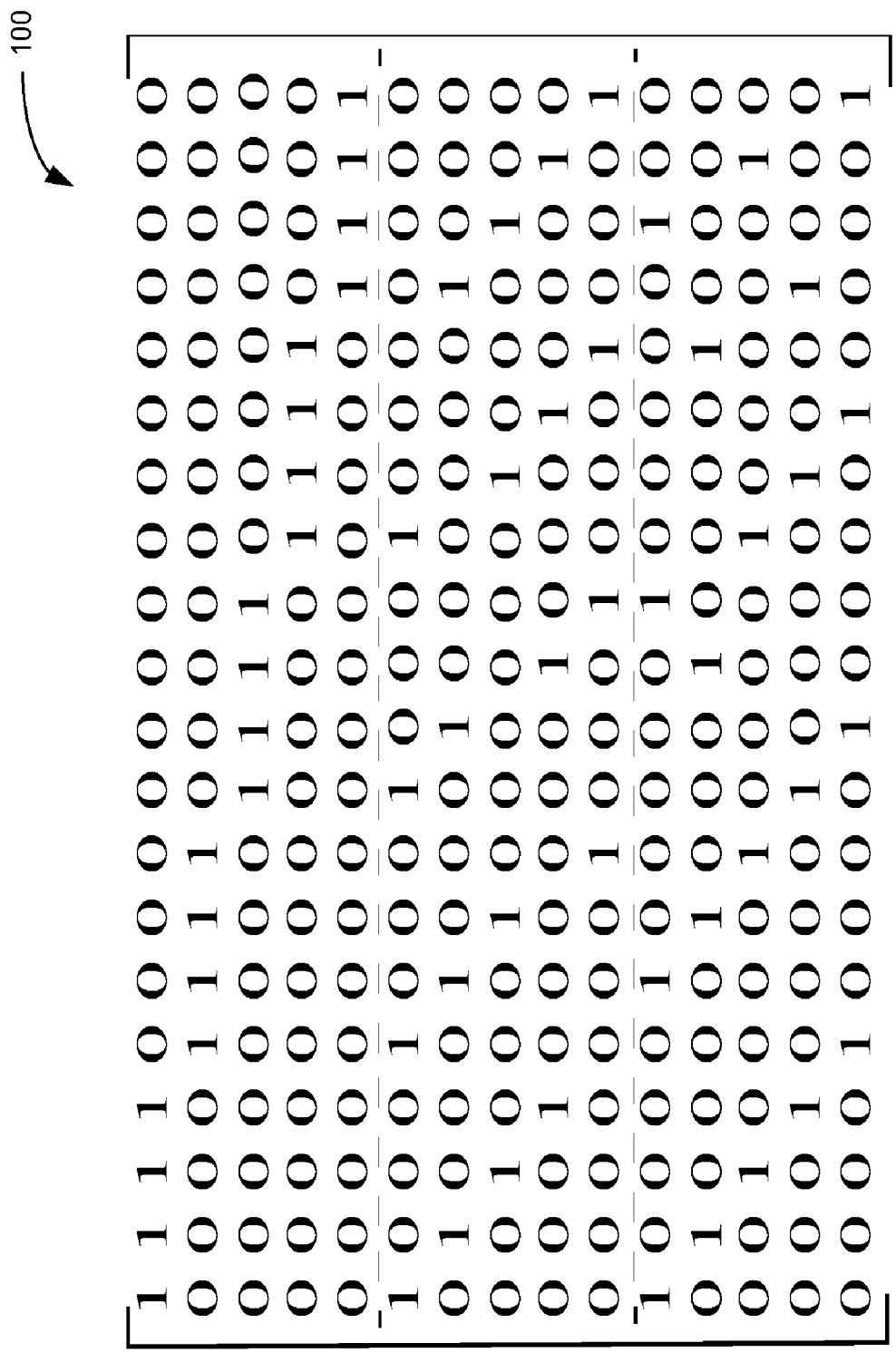
FIG. 1 is a diagram of an H matrix.
Figure 2:
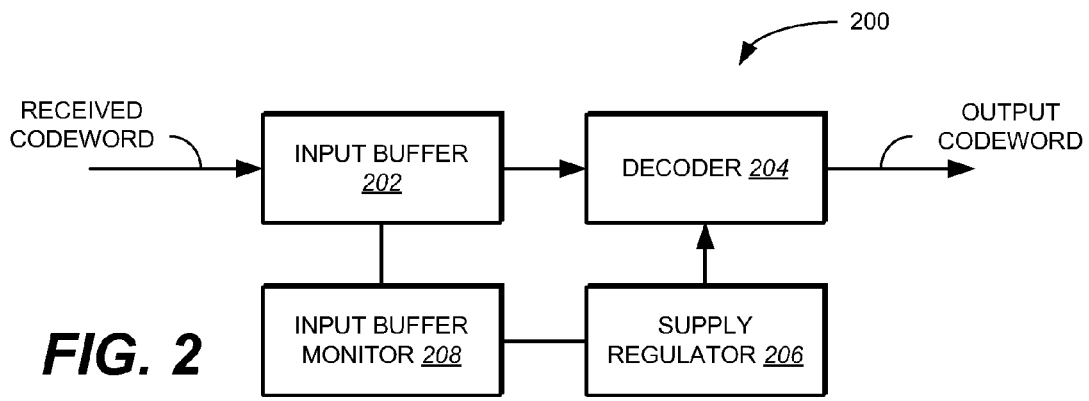
FIG. 2 is a block diagram of a decoding architecture for a decoder according to one implementation.

FIG. 2 shows a block diagram of a decoding architecture 200 in accordance with one implementation of the present invention. In one implementation, the decoding architecture 200 includes an input buffer 202, and a decoder 204. The input buffer 202 is a memory that stores one or more codewords to be processed by the decoder 204. In one implementation, the input buffer is a FIFO (First-In, First-Out) buffer. In one implementation, the decoder 204 is an iterative decoder. Alternatively, the decoder 204 can be any other type of error correcting decoder that processes codewords. In one implementation, the decoding architecture 200 further includes a supply regulator 206 and an input buffer monitor 208 for regulating power to the decoder 204. In one implementation, the input buffer monitor 208 provides a control signal to the supply regulator 206 for adjusting power that is supplied to the decoder 204, for example, based on an empty depth of the input buffer 202, as discussed in greater detail below.

Figure 3:
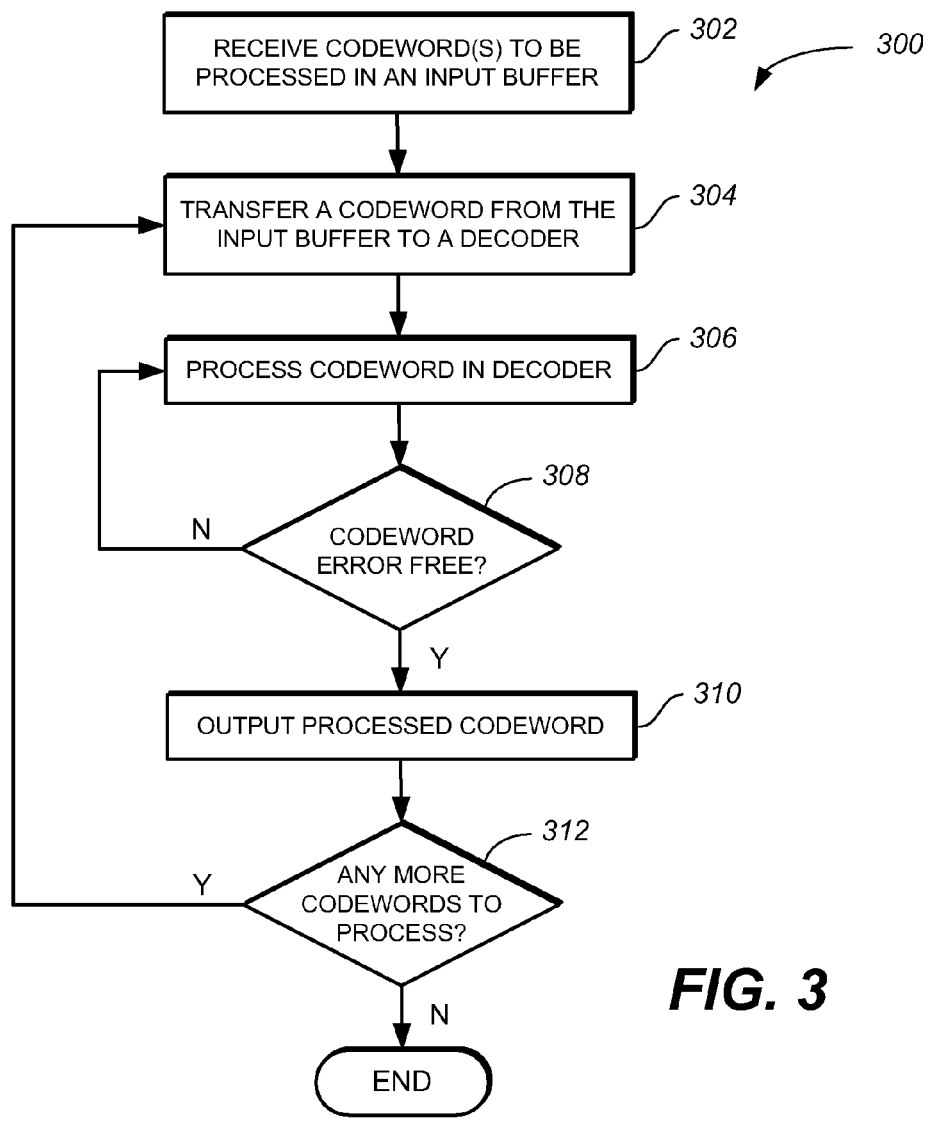
FIG. 3 illustrates a method for decoding a codeword in accordance with one implementation.

FIG. 3 shows a method 300 for processing codewords in accordance with one implementation of the invention. One or more codewords to be processed are stored in an input buffer (e.g., input buffer 202) (step 302). In one implementation, the input buffer receives codewords (to be processed by the decoder) at a rate that is at least faster than the time required for the decoder to fully correct a worst case codeword. The input buffer can receive codewords (to be processed by the decoder) at a constant or variable rate. A codeword is transferred from the input buffer to a decoder (e.g., decoder 204) to be processed (step 304). In one implementation, the transferred codeword is processed iteratively until the codeword becomes error free. For example, in an implementation in which the decoder is a low density parity check (LDPC) decoder, the codeword can be processed iteratively through parity check nodes and equality constraint nodes, as discussed above.

A determination is made whether the codeword is error free (step 308). If the codeword is not yet error free, then the decoder continues to process the codeword (e.g., for another iteration). Once the codeword becomes error free, the codeword is output from the decoder (step 310). A determination is made whether there are additional codewords to be processed by the decoder (step 312). If there are no additional codewords to be processed, then the method 300 ends. Otherwise, the method 300 returns to step 304 and a next codeword is transferred from the input buffer to the decoder.

In one implementation, the accumulation of the excess decoding time over several codewords is an important aspect that makes every small extra (accumulated) decoding time very valuable. Thus, in one implementation, the average decoding time can be chosen close to the minimum decoding time for majority of received codewords. In such an implementation, although the excess decoding time saved in a given cycle may be small, a substantial amount of saved excess decoding can be accumulated over several cycles. Therefore, a large accumulated time can be allocated to a worst case codeword while still keeping the net average decoding cycle short.

Referring back to FIG. 2, delay accumulation can be performed using the input buffer 202 (e.g., an input FIFO buffer) to pipeline the input data codeword for a certain number of cycles. In one implementation, input data codewords are loaded into the input FIFO buffer at a fixed frequency determined by the input data rate. On the output of the input FIFO buffer, (in one implementation) every time that a codeword decoding is completed (e.g., the codeword has become error free), a strobe signal loads in the next codeword from the input FIFO buffer into the decoder. In one implementation, to avoid overflow of the input FIFO buffer, the average decoding speed is selected such that the average read speed from the input FIFO buffer is faster than the fixed write speed into the input FIFO buffer. In one implementation, the extra decoding time saved assists in emptying the input FIFO buffer which provides for more margin in cases that the decoder processes a given codeword (e.g., a worst case codeword) for a relatively long time.

In one implementation, the end of each decoding process is detected by monitoring (through logic) the output codeword for the output codeword to pass (or satisfy) all the parity checks of an H matrix. In this specific implementation, parity is checked if the logic outputs a "zero". Alternatively, parity can be checked if the logic monitoring the output codeword outputs a "one". Combinational logic can be used to perform this function and send the strobe signal to the FIFO buffer for the next read. The combinational logic can be implemented in several ways. For example, one method is to take the whole codeword, separately perform all the parity checks, and then perform a logic OR on the output of the parity check logic blocks.

Figure 4:
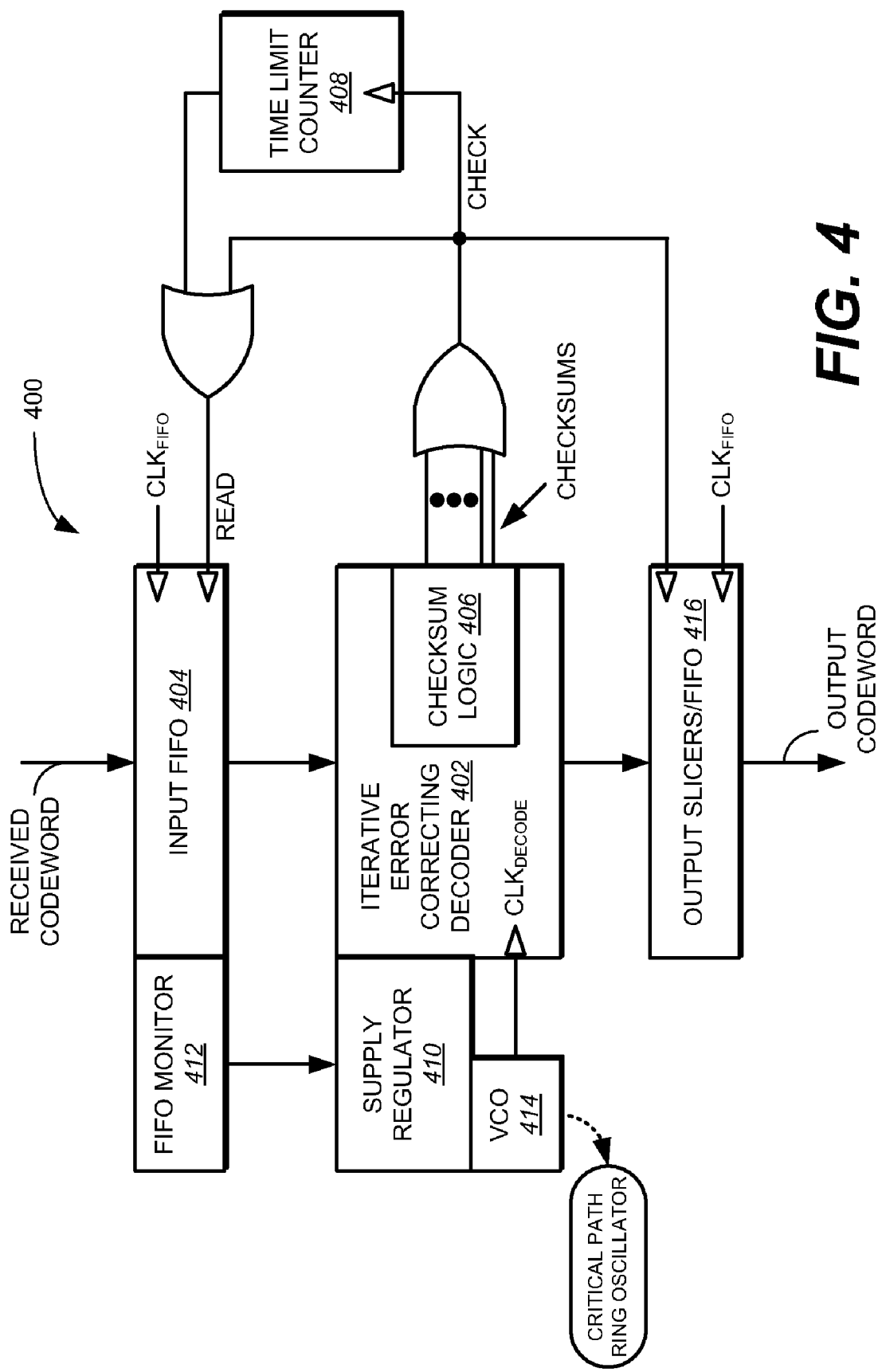
FIG. 4 is a block diagram a decoding architecture according to one implementation.

FIG. 4 illustrates a decoder architecture 400 in accordance with one implementation of the invention. The decoder architecture 400 includes an iterative error correcting decoder 402 and an input FIFO buffer 404. In one implementation, iterative error correcting decoder 402 includes a checksum logic 406 that calculates the checksum for every parity check of the iterative error correcting decoder 402. In one implementation, the outputs of the checksum logic 406 are ORed together and final result is used to trigger the next read from the input FIFO buffer 404. In one implementation, to prevent certain codewords from taking a long decoding time, e.g. falling into trapping sets, the decoder architecture 400 includes a time limit counter 408 that limits the maximum decoding time of any input codeword. Once the time limit counter 408 has reached a pre-determined maximum time limit, the time limit counter 408 triggers the next read from the input FIFO buffer 404. As a result of the extra cycle time saving by using the input FIFO buffer 404, as discussed above, the iterative error correcting decoder 402 can be run at a lower frequency, which is typically about half the maximum frequency to cover the worst case correctly.

One important advantage that one can leverage from the reduction in frequency towards power saving is by reducing the supply voltage while logic speed drops roughly linearly with supply voltage, or more accurately linearly with Vsupply-Vthreshold (where Vthreshold is the threshold voltage of the MOS devices used). The reason is that digital switching power drops in accordance with the squared value of the supply. For example, if a 30% reduction in frequency can be obtained, then the supply voltage can be dropped to 70% of the original value, resulting in a 51% ($0.7^2$=0.49) power saving. So (in one implementation) to take advantage of the time saving by using the input FIFO buffer 404, the power supply to the iterative error correcting decoder 402 is reduced (e.g., through supply regulator 410) so that the iterative error correcting decoder 402 can still perform properly at the reduced frequency. This ensures proper logic operation without any timing failure. Thus, in this case of having an input reference clock, one can build a replica of the logic critical path and monitor the timing of the replica critical path while supply is reduced. The supply can be reduced as much as the timing of the critical path is not violated.

The reduced supply voltage idea can be taken even further to be adjustable according to a response of the iterative error correcting decoder 402 to input data quality. For example, if in a certain condition and environment the iterative error correcting decoder 402 on average takes 5 iteration to process a given codeword for 99% of the times and 8 iteration for a worst case codeword, while in another condition the average iterations per codeword is 3 for 99% of the times and worst case codeword requires 6 iterations, (in one implementation) the iterative error correcting decoder 402 is made intelligent enough to recognize the two cases and, thus, reduce a frequency of the decoder clock ($CLK_{DECODE}$) and thus the supply voltage in the second case and save power accordingly. The can be achieved by a logic (e.g., a FIFO monitor 412) that monitors the average empty depth in the input FIFO 404 over a certain number of frames (or codewords) and controls the supply regulator 410 according to the average empty depth of the input FIFO 404. To ensure the decoder clock frequency never violates any timing requirement at the new regulated supply voltage, (in one implementation) the decoder clock ($CLK_{DECODE}$) is supplied by a VCO 412 (voltage controlled oscillator) block built out of the logic worst critical path connected in a closed ring and supplied by the same regulated supply. This guarantees that the output frequency out of the VCO 412 will never run faster than what is acceptable for worst critical path of the logic. Thus, although a fixed lower decode clock frequency always helps to reduce the supply voltage to get $V^2$ power saving, the latter technique allows an implementation to attain optimum performance for any given arbitrary condition.

In one implementation, as shown in FIG. 4, the output of the iterative error correcting decoder 402 is coupled to an output FIFO 416 (or other suitable type of buffer or memory) to guarantee output codewords can be sent from decoder architecture 400 at a fixed rate and synchronized to the FIFO clock ($Clk_{FIFO}$), which FIFO clock is used to load codewords into the input FIFO 404. The inclusion of the output FIFO 416 is important for applications that require data at a fixed rate.

As a summary, the following is described in this disclosure: In iterative decoders reallocation of decoding time from multiple shorter cycles (which need fewer iterations) to the longer cycles (with the need for higher number of iterations) permits a reduction of the decoder internal frequency at same effective throughput and thus reduction in the supply voltage of the decoder to attain a $V^2$ power savings.

Various implementations of a decoding architecture have been described. Nevertheless, one of ordinary skill in the art will readily recognize that there that various modifications may be made to the implementations, and any variation would be within the scope of the present invention. For example, though examples described above generally described with respect to an iterative decoder, the techniques are applicable to other types of decoders. In addition, the techniques described herein can be applicable to satellite communications (e.g., DVB-S2 (Digital Video Broadcasting)), MIMO-OFDMA cellular systems, as well as read-channel for hard discs, and other systems. Accordingly, many modifications may be made by one of ordinary skill in the art without departing from the scope of the following claims.

What is claimed is:

1. A decoder architecture comprising:
   an input buffer configured to receive and store one or more codewords to be processed;
   a decoder configured to receive codewords one at a time from the input buffer, the decoder to process each codeword only for a minimum amount of time for the codeword to become error free; and
   a supply regulator configured to change a voltage supply to the decoder responsive to an average amount of time of each codeword to become error free.

2. The decoder architecture of claim 1, further comprising an output buffer configured to receive and store codewords output from the decoder, the output buffer to output each codeword stored in the output buffer at a fixed rate.

3. The decoder architecture of claim 1, wherein the decoder includes logic to determine when a given codeword being processed by the decoder has become error free and generate a strobe signal that loads a next codeword from the input buffer into the decoder.

4. The decoder architecture of claim 3, further comprising a time limit counter configured to limit a maximum processing time of any given codeword, wherein once the time limit counter has reached a pre-determined maximum time limit, the time limit counter triggers a load of a next codeword from the input buffer into the decoder.

5. The decoder architecture of claim 1, further comprising an input buffer monitor configured to monitor an average empty depth of the input buffer and to control the supply regulator to reduce a voltage supply to the decoder responsive to a decrease in the average empty depth of the input buffer.

6. The decoder architecture of claim 5, further comprising a voltage controlled oscillator (VCO), the VCO being implemented based on a critical logic path in the decoder, the VCO further clocking the decoder at a frequency to prevent any timing violations for logic within the decoder.

7. The decoder architecture of claim 1, wherein:
the input buffer is a FIFO (First-In, First-Out) buffer; and
the decoder is an iterative decoder.

8. The decoder architecture of claim 7, wherein the iterative decoder is one of a low density parity check (LDPC) decoder, a Hamming decoder, a Reed-Solomon decoder, or a Turbo decoder.

9. A method for processing codewords, the method comprising:
loading one or more codewords to be processed in an input buffer at a first rate;
loading codewords into a decoder one at a time at a second rate from the input buffer, the decoder to process each codeword only for a minimum amount of time for the codeword to become error free; and
changing a voltage supply to the decoder responsive to an average amount of time for each codeword to become error free.

10. The method of claim 9, further comprising:
loading codewords output from the decoder into an output buffer; and
outputting each codeword from the output buffer at a fixed rate.

11. The method of claim 9, wherein the first rate and the second rate are different.

12. The method of claim 9, wherein processing each codeword in the decoder only for a minimum amount of time for the codeword to become error free includes generating a strobe signal that loads a next codeword from the input buffer into the decoder responsive to a determination that the codeword being processed by the decoder has become error free.

13. The method of claim 12, further comprising limiting a maximum processing time of any given codeword of any given codeword using a time limit counter, including triggering a load of a next codeword from the input buffer into the decoder responsive to the time limit counter reaching a predetermined maximum time limit.

14. The method of claim 9, wherein changing a voltage supply to the decoder includes reducing the voltage supply to the decoder responsive to a decrease in the average amount of time for each codeword to become error free.

15. The method of claim 14, further comprising:
monitoring an average empty depth of the input buffer; and
changing a voltage supply to the decoder responsive to a change in the average empty depth of the input buffer.

16. The method of claim 15, further comprising using a voltage controlled oscillator (VCO) to clock the decoder at a frequency to prevent any timing violations for logic within the decoder, the VCO being implemented based on a critical logic path in the decoder.

17. The method of claim 16, wherein the iterative decoder is one of a low density parity check (LDPC) decoder, a Hamming decoder, a Reed-Solomon decoder, or a Turbo decoder.

18. A decoder architecture comprising:
an input buffer configured to receive and store one or more codewords to be processed;
a iterative error correcting decoder configured to receive codewords one at a time from the input buffer, the iterative error correcting decoder to process each codeword only for a minimum amount of time for the codeword to become error free, the iterative error correcting decoder including logic to determine when a given codeword being processed by the iterative error correcting decoder has become error free and generate a strobe signal that loads a next codeword from the input buffer into the iterative error correcting decoder;
an output buffer configured to receive and store codewords output from the iterative error correcting decoder, the output buffer to output each codeword from the output buffer at a fixed rate;
an input buffer monitor configured to monitor an average empty depth of the input buffer, the input buffer to control a supply regulator to change a voltage supply to the decoder responsive to the average empty depth of the input buffer; and
a voltage controlled oscillator (VCO), the VCO being implemented based on a critical logic path in the decoder, the VCO further clocking the decoder at a frequency to prevent any timing violations for logic within the decoder as the voltage supply to the decoder is reduced.

19. The decoder architecture of claim 18, wherein the decoder is clocked with a fixed input clock frequency having been generated separately from the VCO, and the decoder architecture further includes:
a replica of a critical logic path associated with the decoder, wherein a timing of the replica of a critical logic path is monitored to avoid timing violation while the voltage supply to the decoder is reduced.

20. The decoder architecture of claim 18, wherein the iterative decoder is one of a low density parity check (LDPC) decoder, a Hamming decoder, a Reed-Solomon decoder, or a Turbo decoder.

* * * * *